(12) United States Patent
Park

(10) Patent No.: US 7,795,136 B2
(45) Date of Patent: Sep. 14, 2010

(54) METAL WIRING OF SEMICONDUCTOR DEVICE AND FORMING METHOD THEREOF

(75) Inventor: Kyung Min Park, Namdong-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 84 days.

(21) Appl. No.: 11/863,373

(22) Filed: Sep. 28, 2007

(65) Prior Publication Data

US 2008/0136042 A1   Jun. 12, 2008

(30) Foreign Application Priority Data

Dec. 11, 2006 (KR) ............... 10-2006-0125292

(51) Int. Cl.
*H01L 21/4763* (2006.01)
(52) U.S. Cl. ............ 438/637; 438/618; 438/622; 438/623; 438/624; 257/E23.145
(58) Field of Classification Search .......... 438/618, 438/616, 622, 623, 624, 637, 638, 639; 257/E23.145
See application file for complete search history.

(56) References Cited

U.S. PATENT DOCUMENTS

| 6,187,661 | B1 * | 2/2001 | Lou | 438/622 |
| 6,291,333 | B1 * | 9/2001 | Lou | 438/618 |
| 6,518,166 | B1 * | 2/2003 | Chen et al. | 438/622 |
| 7,250,683 | B2 * | 7/2007 | Tsai et al. | 257/774 |
| 2003/0139034 | A1 * | 7/2003 | Yuang | 438/634 |
| 2004/0068082 | A1 * | 4/2004 | Lim et al. | 528/96 |

* cited by examiner

*Primary Examiner*—Matthew Smith
*Assistant Examiner*—John M Parker
(74) *Attorney, Agent, or Firm*—Saliwanchik, Lloyd & Saliwanchik

(57) ABSTRACT

A metal wiring of a semiconductor device and a forming method thereof are provided. A dielectric layer is formed on a semiconductor substrate including a lower metal wiring. A SOG (spin on glass) coating layer is formed on the dielectric layer to inhibit material from another layer from infiltrating into the dielectric layer.

10 Claims, 3 Drawing Sheets

METAL WIRING OF SEMICONDUCTOR DEVICE AND FORMING METHOD THEREOF

CROSS-REFERENCE TO RELATED APPLICATION

The present application claims the benefit under 35 U.S.C. §119 of Korean Patent Application No. 10-2006-0125292, filed Dec. 11, 2006, which is hereby incorporated by reference in its entirety.

BACKGROUND

As semiconductor devices become more integrated, the design rule in next generation ultra-high integrated semiconductor devices becomes more and more fine.

In semiconductor devices having very fine design rules, the wiring or pitch between electrodes is often very small. This can lead to the problem that capacitance between the wirings is generally quite large.

The increase of the capacitance between the wirings typically leads to an increase in RC delay, thereby decreasing the operating speed of the device.

Thus, there exists a need in the art for an improved metal wiring and forming method thereof.

BRIEF SUMMARY

Embodiments of the present invention provide a metal wiring of a semiconductor device and a forming method thereof. Infiltration of materials such as copper or barrier metals from a metal wiring into an interlayer dielectric layer can be inhibited.

A metal wiring of a semiconductor device according to an embodiment of the present invention can comprise a lower metal wiring on a semiconductor substrate, a dielectric layer including a via trench hole on the semiconductor substrate, and a spin on glass (SOG) coating layer formed on the dielectric layer and exposing the lower metal wiring. A barrier metal layer can be provided on the SOG coating layer and the lower metal wiring. A seed layer can be on the barrier metal layer, and an upper metal wiring can be provided on the barrier metal layer in the via trench hole.

In an embodiment of a method for forming a metal wiring of a semiconductor device, a dielectric layer can be formed on a semiconductor substrate, and a via trench hole can be formed in the dielectric layer exposing the lower metal wiring. A SOG coating layer can be formed on the dielectric layer, exposing the lower metal wiring, and a barrier metal layer can be formed on the SOG coating layer and the lower metal wiring. A seed layer can be formed on the barrier metal layer, and an upper metal wiring can be formed in the via trench hole.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 6:
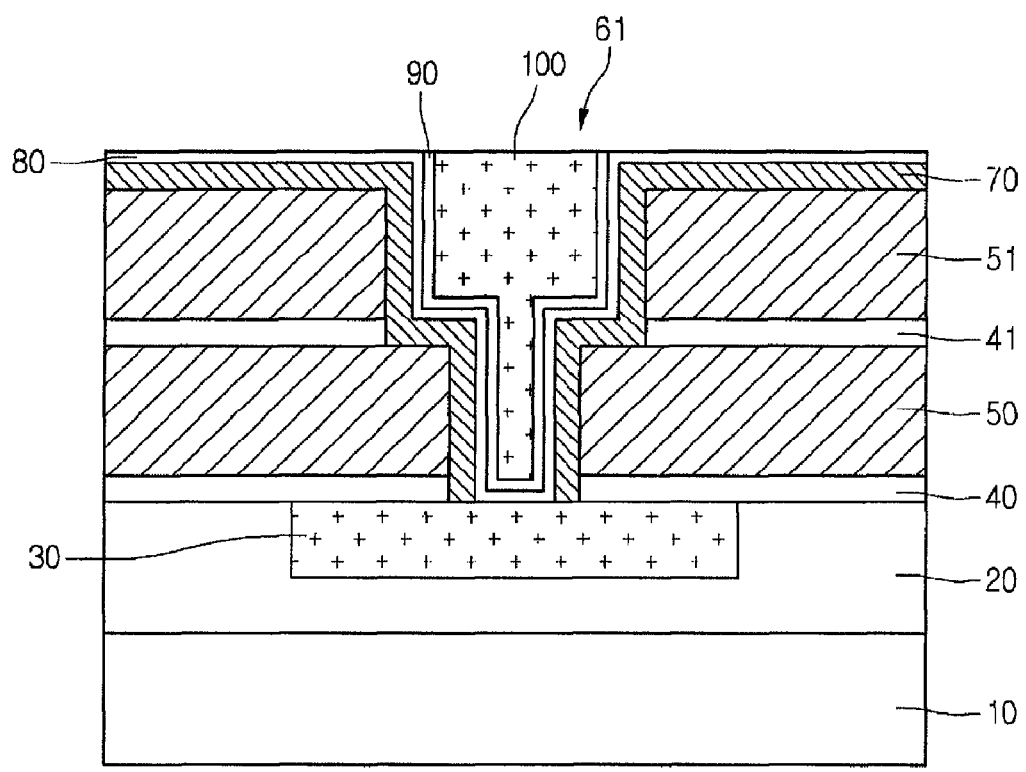

FIG. 6 is a cross-sectional view showing a metal wiring of a semiconductor device according to an embodiment of the present invention.

Referring to FIG. 6, in an embodiment, the metal wiring comprises: a first dielectric layer 50 on a semiconductor substrate 10 including a lower metal wiring 30, and a second dielectric layer 51 on the first dielectric layer 50, where the first and second dielectric layers 50 and 51 are provided with a via trench hole 61. A spin on glass (SOG) coating layer 70 is formed on the first and second dielectric layers 50 and 51. A barrier metal layer 80 can be formed on the SOG coating layer 70, a seed layer 90 can be formed on the barrier metal layer 80, an upper metal wiring 100 can be formed in a via trench hole 61.

Here, an interlayer dielectric layer 20 can be formed on the semiconductor substrate 10. The lower metal wiring 30 can be formed in the interlayer dielectric layer 20.

In one embodiment, a first etch stop layer 40 can be formed on the interlayer dielectric layer 20 and the lower metal wiring 30. Then, the first dielectric layer 50 can be provided on the first etch stop layer 40. A second etch stop layer 41 can be formed on the first dielectric layer 50, and the second dielectric layer 51 can be provided on the second etch stop layer 41.

In an embodiment, the first and second dielectric layers 50 and 51 can each be formed of a porous, low-k material. The porous, low k material can, for example, have a dielectric constant (k) of about 1.1 to about 2.4.

The SOG coating layer 70 can be formed on the first and second dielectric layers 50 and 51 and can be formed to expose the bottom of the via trench hole 61.

The barrier metal layer 80 can be formed on the lower metal wiring 30 such that the upper metal wiring 100 and the lower metal wiring 30 are electrically connected.

In an embodiment, the metal wiring can be formed using a damascene process. Any damascene process known in the art can be used, such as a via first dual damascene, a trench first dual damascene, or a self-align dual damascene. While a dual damascene process using the via first dual method is described below as an example, it is important to note that other damascene processes may be used in other embodiments of the present invention.

Figure 1:
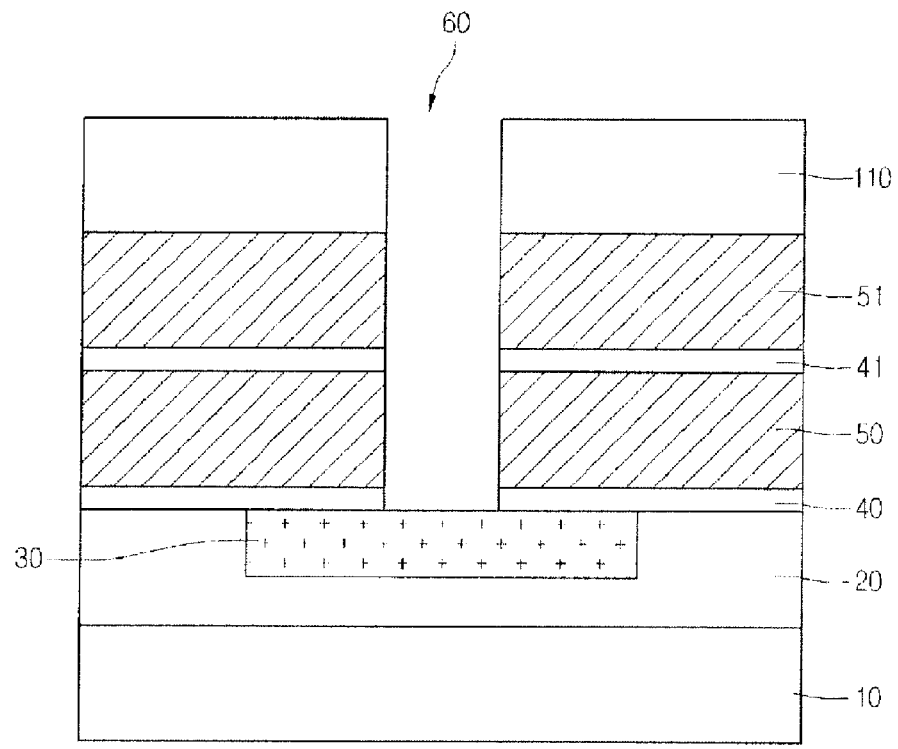
FIGS. 1 to 6 are cross-sectional views showing a method of forming a metal wiring of a semiconductor device according to an embodiment of the present invention.

Referring to FIG. 1, an interlayer dielectric layer 20 including a lower metal wiring 30 can be formed on a semiconductor substrate 10. The lower metal wiring 30 can be formed of any appropriate metal known in the art, for example, copper or aluminum.

A first etch stop layer 40 can be formed on the interlayer dielectric layer 20, and a first dielectric layer 50 can be formed on the first etch stop layer 40. A second etch stop layer 41 can be formed on the first dielectric layer 50, and a second dielectric layer 51 can be formed on the second etch stop layer 41.

In an embodiment, the first and second dielectric layers 50 and 51 can each be formed of a porous, low-k material. For example, the first and second dielectric layers 50 and 51 can be formed of a material with a dielectric constant (k) of about 1.1 to about 2.4. This can lead to a reduction in parasitic capacitance between wirings since the dielectric layers can have low dielectric constants and a wiring material with low resistance can be used, such as copper. Reducing parasitic capacitance between wirings can increase the operating speed and overall performance of a semiconductor device.

A photoresist layer (not shown) can be coated and patterned on the second dielectric layer 51, and a first photoresist pattern 110 can be formed.

The second dielectric layer 51, the second etch stop layer 41, the first dielectric layer 50, and the first etch stop layer 40 can be etched using the first photoresist pattern 110 as an etch mask to form a via hole 60.

Figure 2:
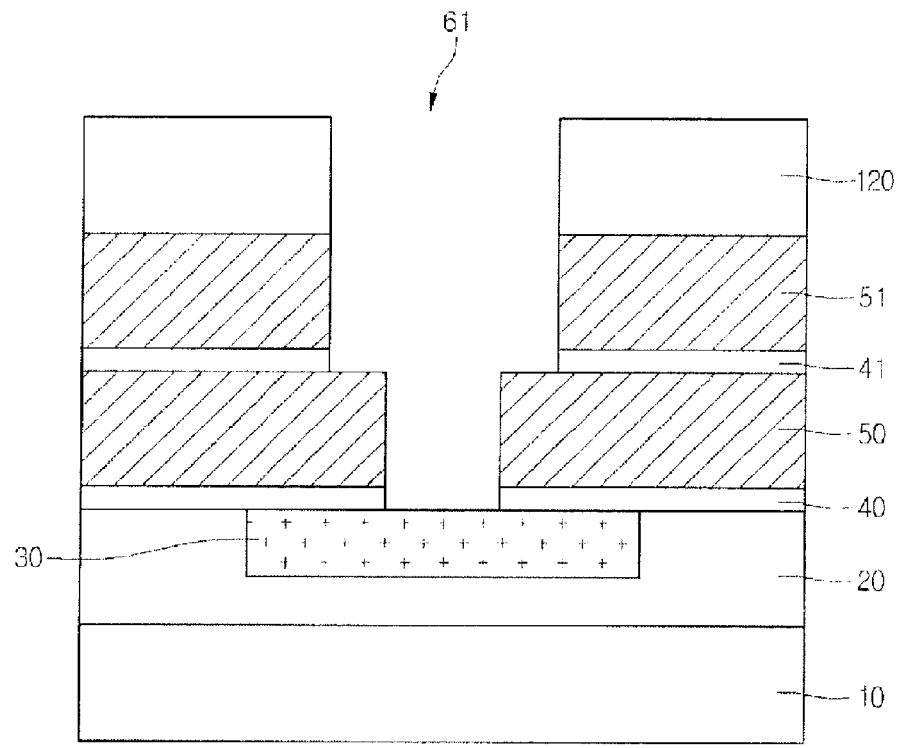

Referring to FIG. 2, the first photo resist pattern 110 can be removed and a second photoresist pattern 120 can be formed on the second dielectric layer 51.

The second dielectric layer 51 and the second etch stop layer 41 can be etched using the second photoresist pattern 120 as an etch mask to form a via trench hole 61.

In many embodiments, the surfaces of the first and second dielectric layers 50 and 51 can be formed of a porous material. Accordingly, a process can be practiced for inhibiting the exposure of pores on the first and second dielectric layers 50 and 51.

Figure 3:
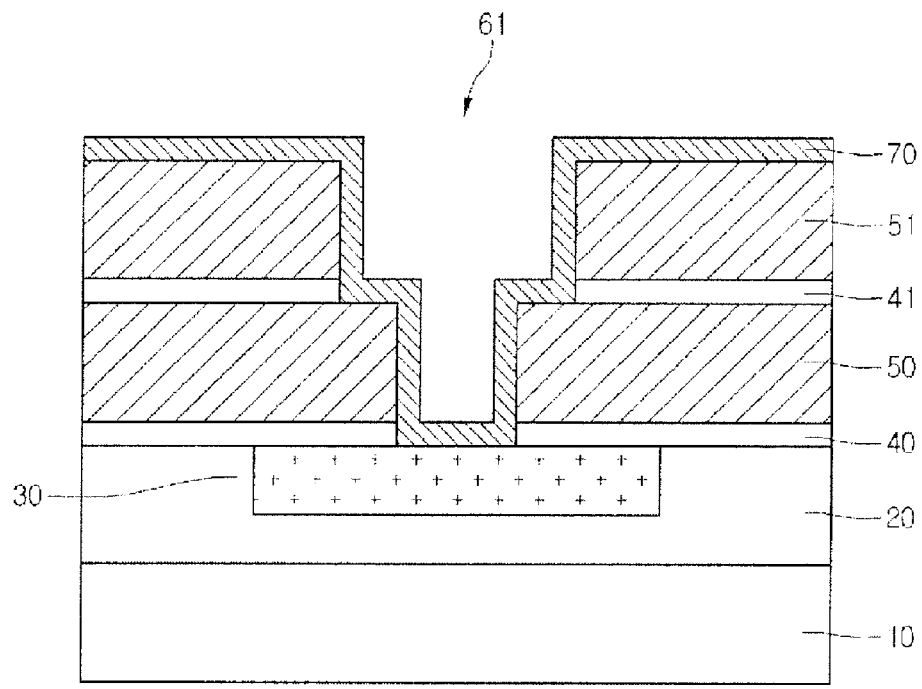

Referring to FIG. 3, a spin on glass (SOG) coating process can be performed on the exposed surfaces of the first and the second dielectric layers 50 and 51 Then, a SOG coating layer 70 can be formed on the second dielectric layer 51 and inside the via trench hole 61 such that the surfaces of the first and second dielectric layers 50 and 51 are covered.

In an embodiment, the SOG coating layer 70 can be formed by a spin coating method. The SOG coating layer 70 has low dielectric properties. Since the material of the SOG coating layer 70 may not be rigid, a thermal process can be performed.

Figure 4:
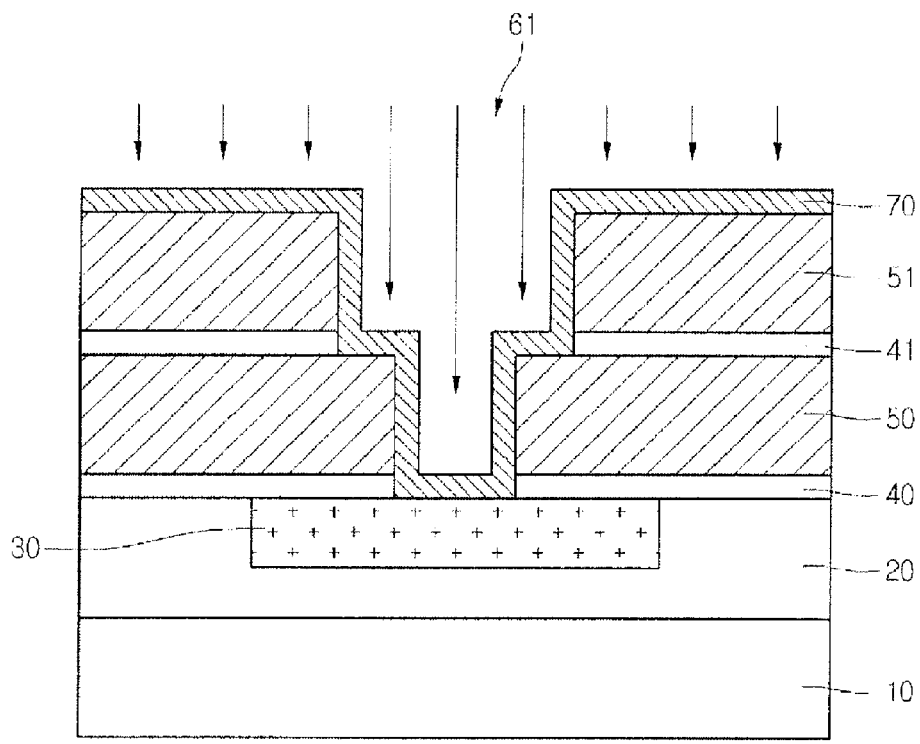

Referring to FIG. 4, a thermal process can be performed on the semiconductor substrate 10 formed with the SOG coating layer 70 to cure the SOG coating layer 70.

For example, the thermal processing process on the SOG coating layer 70 can be performed at a temperature of about 150° C. to about 400° C. for a predetermined time.

Accordingly, the SOG coating layer 70 can inhibit another material, for example a barrier metal material, from infiltrating into the surfaces of the porous material of the first and second dielectric layers 50 and 51. According to embodiments of the present invention, the SOG coating layer 70 seals the pores of the first and second dielectric layers 50 and 51 from infiltration of metal impurities.

Figure 5:
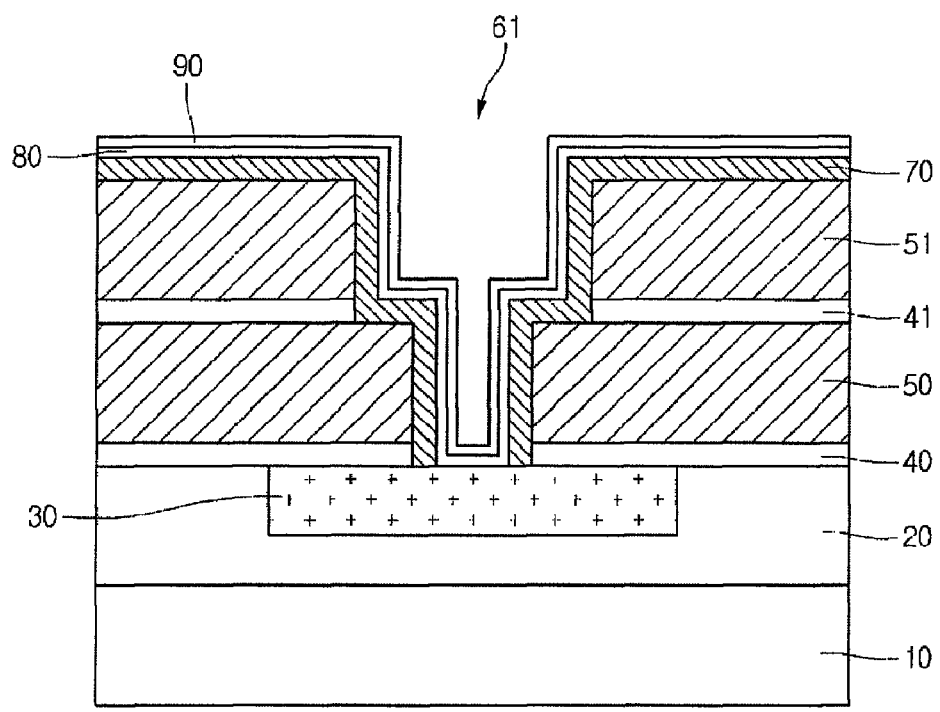

Referring to FIG. 5, a barrier metal layer 80 can be formed on the SOG coating layer 70 and in the via trench hole 61. The barrier metal layer 80 can be formed by depositing Ta, TaN, TaSiN, or any other appropriate material known in the art. Also, the barrier metal layer can be formed using any appropriate deposition method, for example, physical vapor deposition (PVD). The SOG coating layer 70 formed on the lower metal wiring 30 can be removed by performing a sputtering process of the barrier metal layer 80 such that the barrier metal layer 80 can be directly on the upper surface of the lower metal wiring 30.

A seed layer 90 can be formed on the barrier metal layer 80. The seed layer 90 can be formed of any appropriate material known in the art, for example copper (Cu), gold (Au), or platinum (Pt). Also, the seed layer can be formed by chemical vapor deposition (CVD), PVD, atomic layer deposition (ALD), or any other appropriate method known in the art.

Referring to FIG. 6, a metal wiring 100 can be formed on the seed layer 90 in the via trench hole 61. In an embodiment, the lower metal wiring 100 can be formed by depositing copper on the seed layer 90 by an electroplating method. A planarization process, such as chemical mechanical polishing (CMP) can be performed to planarize the deposited metal. In one embodiment, as shown in FIG. 6, the barrier metal layer 80 can be used as the etch stop layer. Then, remaining metal can be removed from the top surface of the second interlayer dielectric layer 51. In other embodiments, the SOG coating layer 70 or the second interlayer dielectric layer 51 can be used as the etch stop layer.

In many embodiments, a SOG coating layer can be formed on the porous, low-k dielectric layers and thermal processing can be performed on the SOG coating layer. Infiltration of metal material into the dielectric layer can be inhibited, making it possible to maintain the low-k properties of the dielectric layers.

Also, since the SOG coating layer protects the dielectric layer, the metal wiring can be formed to be very stable, inhibiting the generation of abnormal patterns. This leads to increased reliability of the metal wiring.

In embodiments of the present invention, the dielectric layer formed of a porous, low-k material can have its low-k properties maintained by the SOG coating layer, which has been cured by thermal processing. The cured SOG coating layer inhibits infiltration of metal material into the dielectric layer, inhibiting the generation of an abnormal pattern and increasing the reliability of the metal wiring.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a metal wiring of a semiconductor device, comprising:

providing a semiconductor substrate including a lower metal wiring;

forming a dielectric layer on the semiconductor substrate and exposing the lower metal wiring through a via hole;

forming a spin on glass (SOG) coating layer on the dielectric layer including in the via hole;

forming a barrier metal layer on the SOG coating layer and the lower metal wiring; and forming an upper metal wiring on the barrier metal layer, electrically connected to the lower metal wiring;

wherein the dielectric layer comprises a first dielectric layer and a second dielectric layer, and wherein the method further comprises:

forming a first etch stop layer below the first dielectric layer; and forming a second etch stop layer on the first dielectric layer and below the second dielectric layer.

2. The method according to claim 1, wherein forming the upper metal wiring comprises:

forming a seed layer on the barrier metal layer; and performing an electroplating process.

3. The method according to claim 1, comprising:
forming the first etch stop layer on the semiconductor substrate and the lower metal wiring;
forming the first dielectric layer on the first etch stop layer;
forming the second etch stop layer on the first dielectric layer;
forming the second dielectric layer on the second etch stop layer; and
forming the via hole and a trench above the via hole exposing the lower metal wiring.

4. The method according to claim 3, wherein forming the via hole and the trench comprises:
forming the via hole by etching through the second dielectric layer, the second etch stop layer, the first dielectric layer, and the first etch stop layer; and
forming the trench by etching through the second dielectric layer and the second etch stop layer.

5. The method according to claim 3, wherein forming the SOG coating layer comprises covering the sidewalls of the trench and via hole.

6. The method according to claim 1, wherein the dielectric layer comprises a porous material.

7. The method according to claim 1, wherein the dielectric layer comprises a material with a dielectric constant of about 1.1 to about 2.4.

8. The method according to claim 1, wherein the SOG coating layer has low dielectric properties.

9. The method according to claim 1, wherein the barrier metal layer comprises Ta, TaN, or TaSiN.

10. The method according to claim 1, further comprising removing a portion of the SOG coating layer to expose the lower metal wiring before forming the barrier metal layer.

* * * * *